(12) United States Patent
Bhatnagar et al.

(10) Patent No.: US 9,157,953 B2
(45) Date of Patent: Oct. 13, 2015

(54) TEST SYSTEMS WITH CABLES THAT SUPPORT MULTIPLE COMMUNICATIONS BUSES

(75) Inventors: Anuj Bhatnagar, Sunnyvale, CA (US); James L. McPeak, Fremont, CA (US); Srdjan Sobajic, San Carlos, CA (US); Nelson Fong, Elk Grove, CA (US)

(73) Assignee: Apple Inc., Cupertino, CA (US)

( * ) Notice: Subject to any disclaimer, the term of this patent is extended or adjusted under 35 U.S.C. 154(b) by 291 days.

(21) Appl. No.: 13/107,416

(22) Filed: May 13, 2011

(65) Prior Publication Data

US 2012/0290246 A1 Nov. 15, 2012

(51) Int. Cl.
*G01R 31/00* (2006.01)
*G06F 11/25* (2006.01)
*G01R 31/28* (2006.01)

(52) U.S. Cl.
CPC .................................. *G01R 31/2844* (2013.01)

(58) Field of Classification Search
CPC .............................. G06F 11/2273; G06F 19/00
USPC .......... 702/122, 123, 117, 119; 324/534, 533, 324/522, 538, 527
See application file for complete search history.

(56) References Cited

U.S. PATENT DOCUMENTS

| | | | |
|---|---|---|---|
| 6,151,653 A * | 11/2000 | Lin et al. ........................ | 710/305 |
| 7,002,354 B1 | 2/2006 | Pannell | |
| 7,187,193 B2 | 3/2007 | Wallquist | |
| 7,218,275 B2 | 5/2007 | Han | |
| 7,293,122 B1 | 11/2007 | Schubert et al. | |
| 7,308,608 B1 | 12/2007 | Pleis et al. | |
| 7,428,663 B2 | 9/2008 | Morton et al. | |
| 7,663,805 B2 | 2/2010 | Zaloum et al. | |
| 7,802,044 B2 | 9/2010 | Chien et al. | |
| 2002/0053045 A1 * | 5/2002 | Gillenwater et al. ........... | 714/38 |
| 2005/0278147 A1 * | 12/2005 | Morton et al. ................ | 702/183 |
| 2008/0052323 A1 | 2/2008 | Dodge et al. | |
| 2009/0043444 A1 * | 2/2009 | Gettner et al. ................... | 701/29 |
| 2009/0157356 A1 * | 6/2009 | Jiang et al. .................... | 702/183 |
| 2010/0073014 A1 | 3/2010 | Maslen | |

(Continued)

FOREIGN PATENT DOCUMENTS

| | | |
|---|---|---|
| CN | 101051067 | 10/2007 |
| DE | 19622532 | 12/1997 |

OTHER PUBLICATIONS

Bhatnagar, U.S Appl. No. 13/183,431, filed Jul. 15, 2011.

*Primary Examiner* — Sujoy Kundu
*Assistant Examiner* — Ricky Ngon
(74) *Attorney, Agent, or Firm* — Treyz Law Group; G. Victor Treyz; Michael H. Lyons

(57) ABSTRACT

A test system may include test stations for testing a device under test. The test stations may each include test equipment that may be connected to a device under test using a test cable. The test cable may include a status indicator to indicate when tests have been passed or have failed. A first connector at one end of the test cable may be coupled to the test equipment. A second connector at an opposing end of the test cable may be coupled to the device under test. Communications through the first connector may use a first communications protocol. Communications through a first set of contacts in the second connector may use the first communications protocol. Communications through a second set of contacts in the second connector may use a second communications protocol.

17 Claims, 5 Drawing Sheets

(56) References Cited

U.S. PATENT DOCUMENTS

| | | |
|---|---|---|
| 2010/0075604 A1 | 3/2010 | Lydon et al. |
| 2010/0201567 A1 | 8/2010 | Lydon et al. |
| 2010/0235552 A1 | 9/2010 | Holden et al. |
| 2010/0235739 A1 | 9/2010 | Rathi et al. |
| 2010/0283624 A1 | 11/2010 | Krueger |
| 2011/0055407 A1 | 3/2011 | Lydon et al. |

* cited by examiner

TEST SYSTEMS WITH CABLES THAT SUPPORT MULTIPLE COMMUNICATIONS BUSES

BACKGROUND

This relates to testing, and, more particularly, to testing electronic devices during manufacturing.

Electronic devices such as portable computers, media players, cellular telephones, set-top boxes, and other electronic equipment must generally be tested during manufacturing. During testing, an electronic device that is being tested is often referred to as a device under test. In a typical scenario, a device under test may be passed through multiple test stations. At each test station, the device under test may be coupled to a different set of test equipment. Different types of test stations may communicate with the device under test using different types of communications links. For example, some test stations may communicate with the device under test using a Universal Serial Bus (USB) path, whereas other test stations may communicate with the device under test using a Universal Asynchronous Receiver/Transmitter (UART) path. The use of different communications links such as these may make it difficult or impossible to perform more than one type of activity at the same test station and may lead to other inefficiencies.

It would therefore be desirable to be able to provide improved test systems for testing devices under test using multiple types of communications links.

SUMMARY

A test system may include test stations for testing a device under test. The test stations may each include test equipment that may be connected to a device under test using a test cable. The test cable may include a status indicator to indicate when tests have been passed or have failed.

A first connector at one end of the test cable may be coupled to the test equipment. A second connector at the opposing end of the test cable may be coupled to the device under test. Communications through the first connector may use a first communications protocol. Communications through a first set of contacts in the second connector may use the first communications protocol. Communications through a second set of contacts in the second connector may use a second communications protocol.

The first communications protocol may be, for example, a Universal Serial Bus (USB) communication protocol. The second communications protocol may be, for example, a Universal Asynchronous Receiver Transmitter (UART) protocol.

Software such as test programs and an operating system for the device under test may be loaded from the test equipment into the device under test through the first connector and the first set of contacts for the second connector using the first communications protocol. Corresponding test logs and other test results may be conveyed from the device under test to the test equipment through the same path. Test data such as test commands and test results may be conveyed between the test equipment and the device under test through the first connector and the second set of contacts using the second communications protocol.

Further features of the invention, its nature and various advantages will be more apparent from the accompanying drawings and the following detailed description of the preferred embodiments.

DETAILED DESCRIPTION

Electronic devices such as cellular telephones, media players, computers, set-top boxes, and other electronic equipment may be tested and loaded with software during manufacturing. During these operations, electronic devices may be referred to as devices under test. Following testing, a device that has passed its tests may be shipped to a customer.

Figure 1:
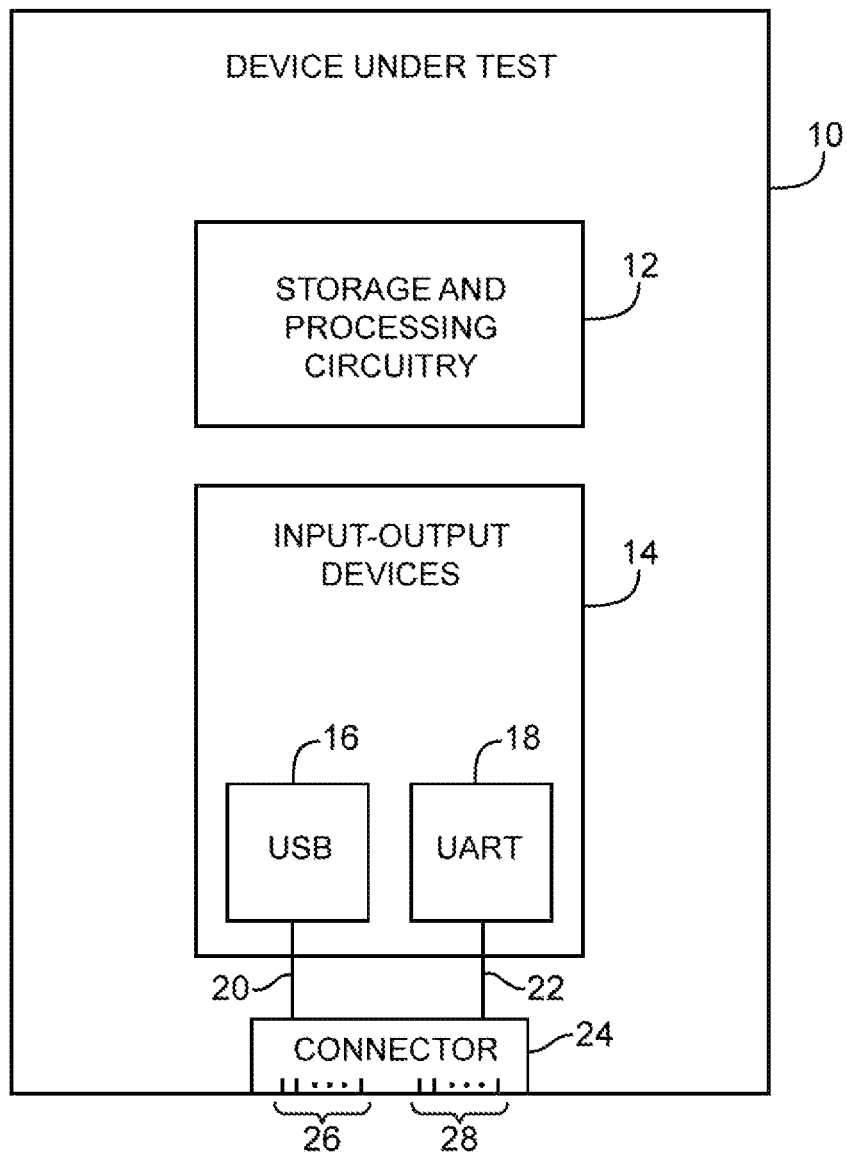
FIG. 1 is a diagram of an illustrative device under test of the type that may be tested using a test system in accordance with an embodiment of the present invention.

An illustrative electronic device of the type that may be tested during manufacturing is shown in FIG. 1. As shown in FIG. 1, device under test 10 may include storage and processing circuitry 12 and input-output devices 14. Storage and processing circuitry 12 may include microprocessors, microcontrollers, digital signal processor integrated circuits, application-specific integrated circuits, and other processing circuitry. Volatile and non-volatile memory circuits such as random-access memory, read-only memory, hard disk drive storage, solid state drives, and other storage circuitry may also be included in storage and processing circuitry 12.

Storage and processing circuitry 12 may use input-output devices 14 to obtain user input and to provide output to a user. Input-output devices 14 may include speakers, microphones, sensors, buttons, keyboards, displays, touch sensors, wireless circuitry such as wireless local area network transceiver circuitry and cellular telephone network transceiver circuitry, and other components for receiving input and supplying output.

Device under test 10 may include one or more input-output ports. For example, device under test 10 may include a connector such as connector 24 for forming a data input-output port. Connector 24 may have a number of contacts (sometimes referred to as pins). When a mating connector is plugged into connector 24, contacts (pins) on the mating connector will make electrical connections with the contacts in connector 24. Data may then be conveyed between device under test 10 and equipment that is electrically connected to the mating connector. In a normal (non-testing) environment, connector 24 may be used to couple the device to external equipment such as a computer or accessory (as examples). During testing, connector 24 may be used to handle test data (e.g., test commands and test results). Connector 24 may also be used in loading an operating system and other software.

Different sets of contacts in connector 24 may be associated with different communications buses and different associated communications protocols. For example, device under test may use a first communications circuit such as Universal Serial Bus (USB) communications circuit 16 (e.g., a USB endpoint) to handle USB communications through contacts 26 and may use a second communications circuit such as Universal Asynchronous Receiver Transmitter (UART) communications circuit 18 to handle UART communications through contacts 28. Using USB communications protocols and USB circuit 16, device under test 10 can communicate over a USB bus coupled to contacts 26. Using UART communications protocols and UART circuit 18, device under test 10 can communicate over a UART bus coupled to contacts 28.

Different buses and protocols may be suitable for handling different types of communications traffic. For example, USB communications may be suitable for loading test software (test programs) onto device under test 10, for conveying test logs and other such test results that are generated by the test programs from device under test 10 to external test equipment, and for loading an operating system or other code from test equipment to device under test 10 following successful test operations. UART communications may be suitable for transferring test commands from external test equipment to device structures under test 10. For example, UART communications may be used to send a "baseband power up" command from external test equipment to a baseband processor integrated circuit or other wireless communications circuit in device under test 10. As another example, test equipment may use UART communications to send a "video on" or "video off" test command to video circuitry in device under test 10 or may send commands to device under test 10 that that exercise audio circuitry in device under test 10. UART communications may also be used by test equipment that is coupled to device under test 10 when the test equipment wants to query device under test 10 for test results.

Figure 2:
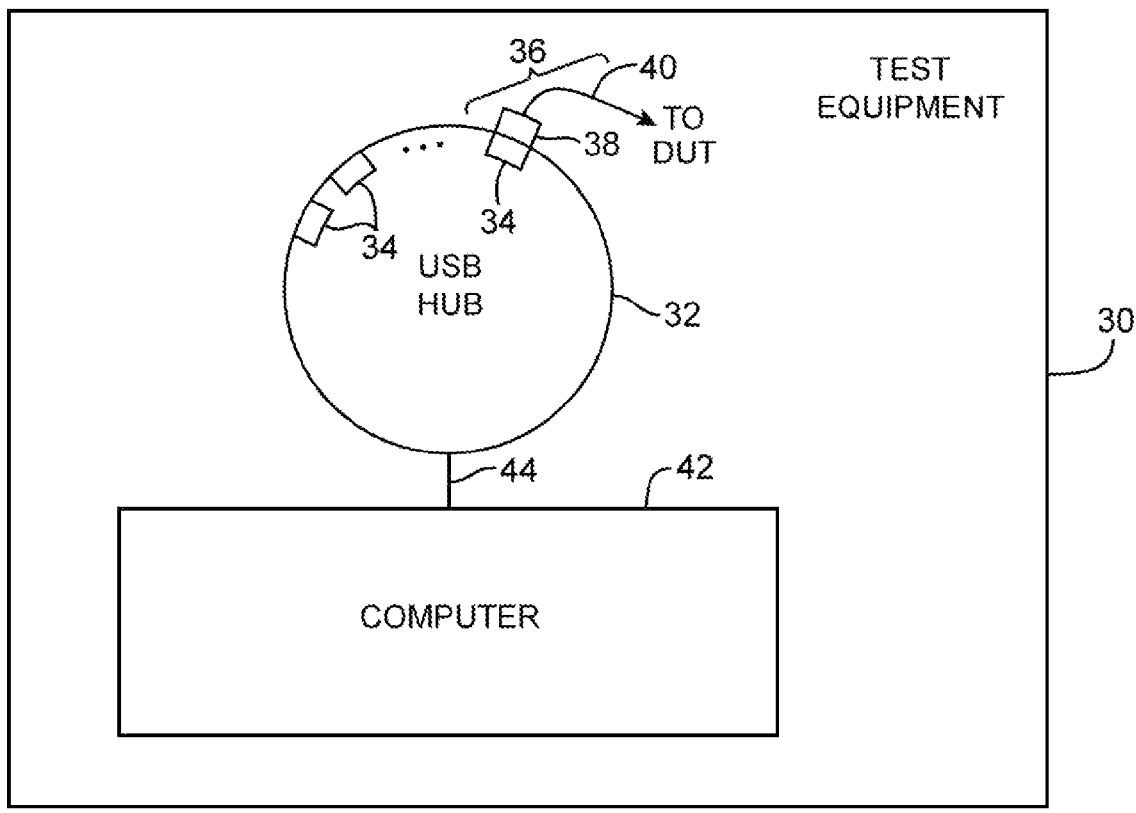
FIG. 2 is a diagram of illustrative test equipment for testing a device under test at a test station in accordance with an embodiment of the present invention.

Test equipment for testing device under test 10 of FIG. 1 may be formed using one or more computers, dedicated test units that perform test functions, and other suitable computing and test equipment. Illustrative test equipment 30 for testing device under test 10 is shown in FIG. 2. In the example of FIG. 2, test equipment 30 includes a computer such as computer 42 that is coupled to a USB hub such as USB hub 32 by USB path 44. USB hub 32 may, if desired, be integrated into computer 42.

USB hub 32 may have multiple USB ports such as ports formed from USB connectors 34. During testing, multiple devices under test may be plugged into hub 32 using connectors 34 to support parallel testing. As shown in FIG. 2, cables such as cable 36 may have a cable (wires) 40 that is terminated in connectors. The end of cable 36 that is connected to test equipment 30 may, for example, have a connector such as USB connector 38 that is configured to mate with USB connector 34 in USB hub 32.

Figure 3:
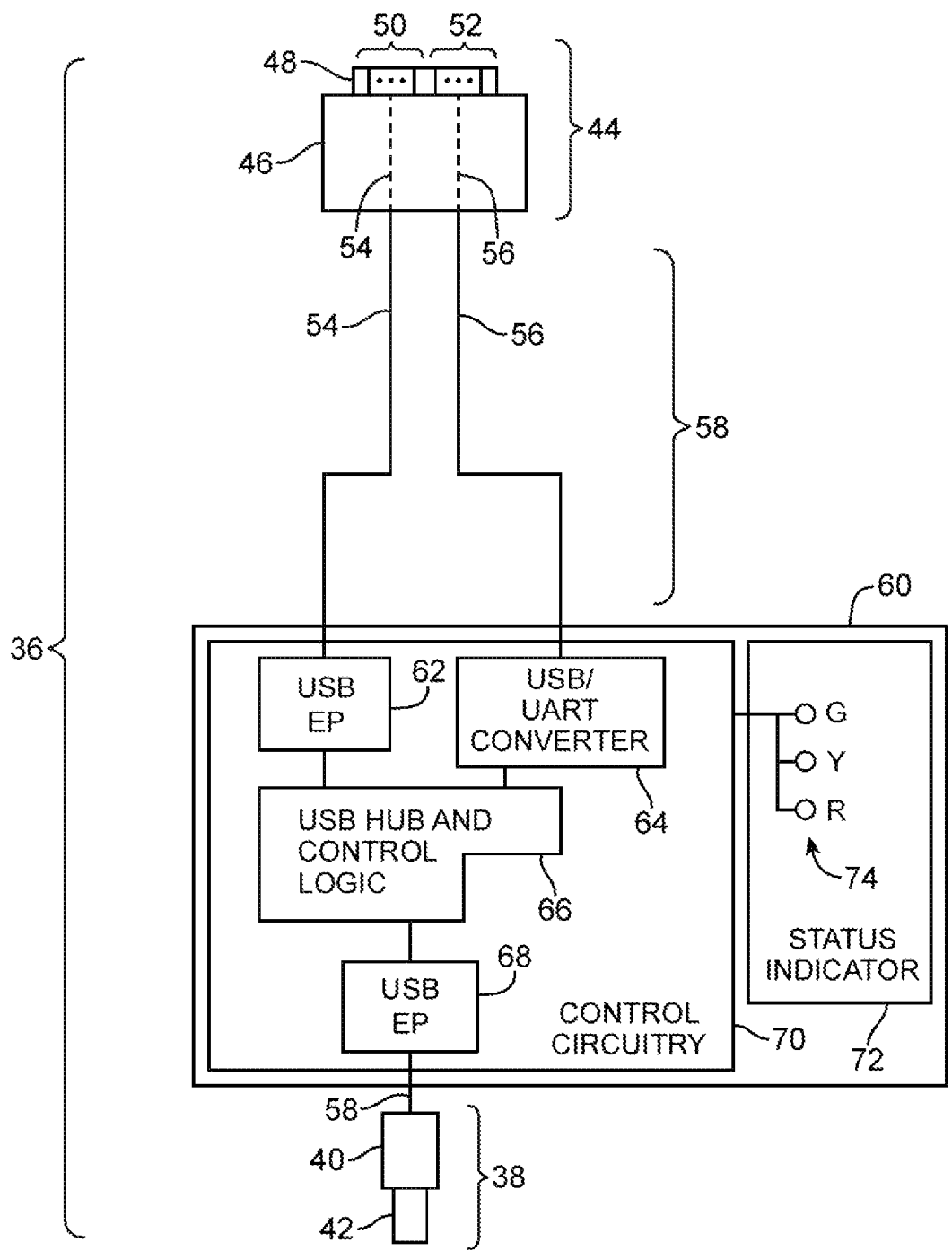
FIG. 3 is a diagram of an illustrative cable that may be used to couple a device under test to test equipment at a test station in accordance with an embodiment of the present invention.

Cable 36 may have interface circuitry that converts USB traffic from test equipment 30 into USB and UART traffic for respectively communicating with USB circuit 16 and UART circuit 18 in FIG. 1. An illustrative configuration that may be used for cable 36 is shown in FIG. 3. As shown in FIG. 3, cable 36 may have a first end that is terminated with connector 38 and an opposing second end that is terminated with connector 44. Connector 38 may be a USB connector having a housing such as housing 40 that is used to house USB connector structure 42. Connector structure 42 may mate with a corresponding connector structure in connectors 34 of FIG. 2. Connector 44 may be a connector such as a 30-pin data connector. As shown in FIG. 3, connector 44 may have a connector housing such as housing 40 in which connector structure 48 (e.g., a 30-pin connector structure) is mounted. Connector structure 48 may be configured to mate with connector 24 of FIG. 1. When mated in this way, contacts (pins) 50 of connector 44 may mate with corresponding contacts 26 in connector 24 and contacts (pins) 52 of connector 44 may mate with corresponding contacts 28 in connector 24. In general, connectors 38 and 44 may be implemented using any suitable types of connectors (e.g., USB, mini USB, Firewire®, 30-pin, Ethernet, audio connectors such as TRRS connectors, video connectors such as DVI, VGA, and HDMI connectors, or other types of signal connectors). The use of USB and 30-pin connectors in the example of FIG. 2 is merely illustrative.

Connectors 44 and 38 may be coupled using cable paths 58. Cable paths 58 may include wires (e.g., wires bundled to form cables or other wired paths). Data conversion circuitry 60 may be interposed in the wired path between connectors 44 and 38. As shown in FIG. 3, at connector 44, cable path 58 may include wires such as wires 54 that are connected to contacts 50 in connector structure 48 and may include wires such as wires 56 that are connected to contacts 52 in connector structure 48. The portion of wired path 58 between connector 38 and circuitry 60 may include wires for coupling USB connector 38 to USB communications circuitry (USB endpoint) 68. Wired path 54 may be coupled to USB communications circuitry (USB endpoint) 62. Wired path 56 may be coupled to USB-UART converter 64.

Control circuitry 70 may use USB communications circuitry 62, USB-UART converter 64, USB communications circuitry 68, and USB hub and control logic 66 to create an interface between connector 38 and connector 44. USB traffic that is supplied to connector 38 from test equipment (FIG. 2) may contain data that is destined to the USB portion of connector 44 (i.e., contacts 50) and may contain data that is destined to the UART portion of connector 44 (i.e., contacts 52). Control circuitry 70 may route the traffic that is destined to the USB portion of connector 44 to USB communications circuit 62 through USB communications circuitry 68 and circuitry 66 for transmission to contacts 50. Control circuitry 70 may route the traffic that is destined to the UART portion of connector 44 to USB-UART converter 64 through USB communications circuitry 68 and circuitry 66. USB-UART converter 64 may convert the outgoing data to data using UART communications protocols suitable for communicating with UART circuitry 18 of FIG. 1. Control circuitry 70 may route USB traffic from USB circuit 16 of device structures under test 10 and contacts 52 to connector 38 using USB communications circuitry 62, circuitry 66, and USB communications circuitry 68. Control circuitry 70 may route UART traffic from UART circuitry 18 to USB communications circuitry 68 via USB-UART converter 64 (which converts UART traffic into USB traffic) and circuitry 66. Control circuitry 70 therefore serves as an interface between the single communications bus (i.e., the USB bus) that is associated with connector 38 and the two communications buses (i.e., the USB bus and the UART bus) that are respectively associated with the two sets of contacts (50 and 52) in connector 44.

If desired, cable 36 may include status indicator 72 for providing test status information to an operator of the test system. Status indicator 72 may include a display, one or more light-emitting diodes 74, lamps, audio components such as speakers or tone generators, or any other suitable components for generating visual and/or audible status output for an operator. In the example of FIG. 3, status indicator 72 includes three light-emitting components (e.g., light-emitting diodes) color-coded green, yellow, and red. If desired, other numbers of light-emitting components, light-emitting components with different colors, and other status indicator components may be used in status indicator 72. The example of FIG. 3 that uses red, green, and yellow lights is merely illustrative.

Figure 4:
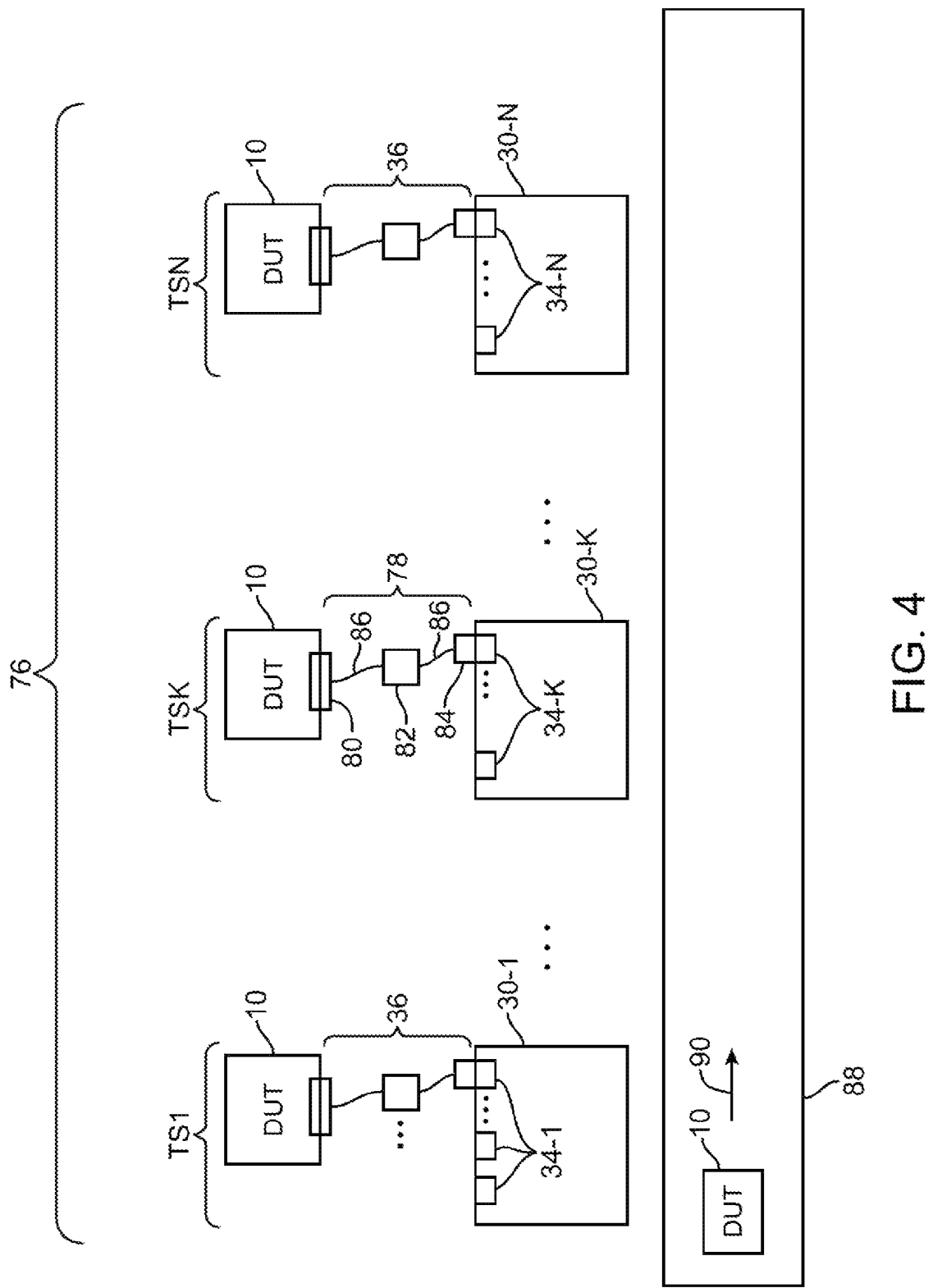
FIG. 4 is a diagram of an illustrative test system of the type that may include multiple test stations in which devices under test are coupled to test equipment using cables of the type shown in FIG. 3 in accordance with an embodiment of the present invention.

FIG. 4 is a diagram of an illustrative test system that may be used in testing device structures under test 10. As shown in FIG. 4, test system 76 may contain multiple test stations TS1 . . . TSK . . . TSN arranged along conveyor belt 88. Initial test station TS1 may include test equipment 30-1 with connectors 34-1 such as USB connectors. Intermediate test stations TSK may have test equipment 30-K with USB connectors 34-K. Final test station TSN may have test equipment 30-N with USB connectors 34-N. Equipment 30-1, 30-K and 30-N may be, for example, equipment such as equipment 30 of FIG. 2.

There may, in general, be any suitable number of test stations in system 76 (e.g., one or more, two or more, three or more, or four or more). Conveyor belts such a conveyor belt 88 moving in direction 90 or other structures may be used to assist test system operators in moving devices under test 10 between test stations in test system 76.

Initially, a device under test may be placed on the left-hand end of conveyor belt 88 (as an example). An operator may remove the device under test and may test the device under test at the first test station (TS1). Following successful operations at the first test station, the device under test may be transferred to subsequent test stations (e.g., one or more intermediate test stations TSK). If testing at the intermediate test stations is successful, testing and final manufacturing operations (e.g., installation of an operating system) may be performed at final test station TSN. If the device under test passes testing at final test station TSN, the device may be shipped to a customer (e.g., a store or an end user).

Each test station may, in general, be used to perform one or more different types of operation on device structures under test 10. For example, test station TS1 may be used in loading test software onto device under test 10 and may be used in performing an initial test or series of tests. Different tests may be performed at intermediate test stations TSK. Final test station TSN may be used to perform final tests and may be used to load the operating system onto device under test.

The different types of operations that are performed at the different test stations and that are performed at different times at the same test station may require use of different communications buses in cable 36. For example, some operations (e.g., loading software such as a test program or an operating system) may be performed using USB communications. Other operations (e.g., sending test commands and gathering corresponding test results) may be performed using UART communications. When cables such as cable 36 are used to couple device under test 10 to test equipment 30, there is no need to swap cables and reconfigure test equipment in the middle of testing. A single cable connection may be formed that may be left in place during all (or substantially all) test operations at that test station. Because both USB and UART communications can be handled over the same cable without need to adjust the connections between the cable, device under test, and test equipment, multiple operations may be performed at a single test station. For example, test program loading operations or operating system loading operations using the USB path in the cable may be performed at the same test station in which UART test commands and UART test results are conveyed between the device under test and the test equipment using the UART path in the cable.

During testing, status indicator 72 may be used to convey status information to an operator. For example, the yellow light-emitting component (Y) in status indicator 72 may flash or otherwise be illuminated during testing, the red light-emitting component (R) in status indicator 72 may be illuminated when a fault is detected in device under test 10, and the green light-emitting component (G) in status indicator 72 may be illuminated when device under test 10 passes the tests at a particular test station.

As shown in FIG. 4, it is not necessary for each test station to use cables such as cable 36 of FIG. 3. For example, intermediate test stations TSK may use cable 78. Cable 78 may have a converter such as converter 82 interposed between cable sections 86. Cable 78 may have connector 80 coupled to device structures under test and connector 84 coupled to test equipment 30-K. Converter 82 may convert USB traffic from connector 84 into UART traffic for connector 80 and vice versa (i.e., cable 78 may contain only a single USB-UART path, without including a path such as USB-USB path 54 of FIG. 3). If desired, other cable branches may be coupled to cable 78 of FIG. 4 and/or cable 78 may be implemented using a cable such as cable 36 of FIG. 3. The example of FIG. 4 is merely illustrative.

Figure 5:
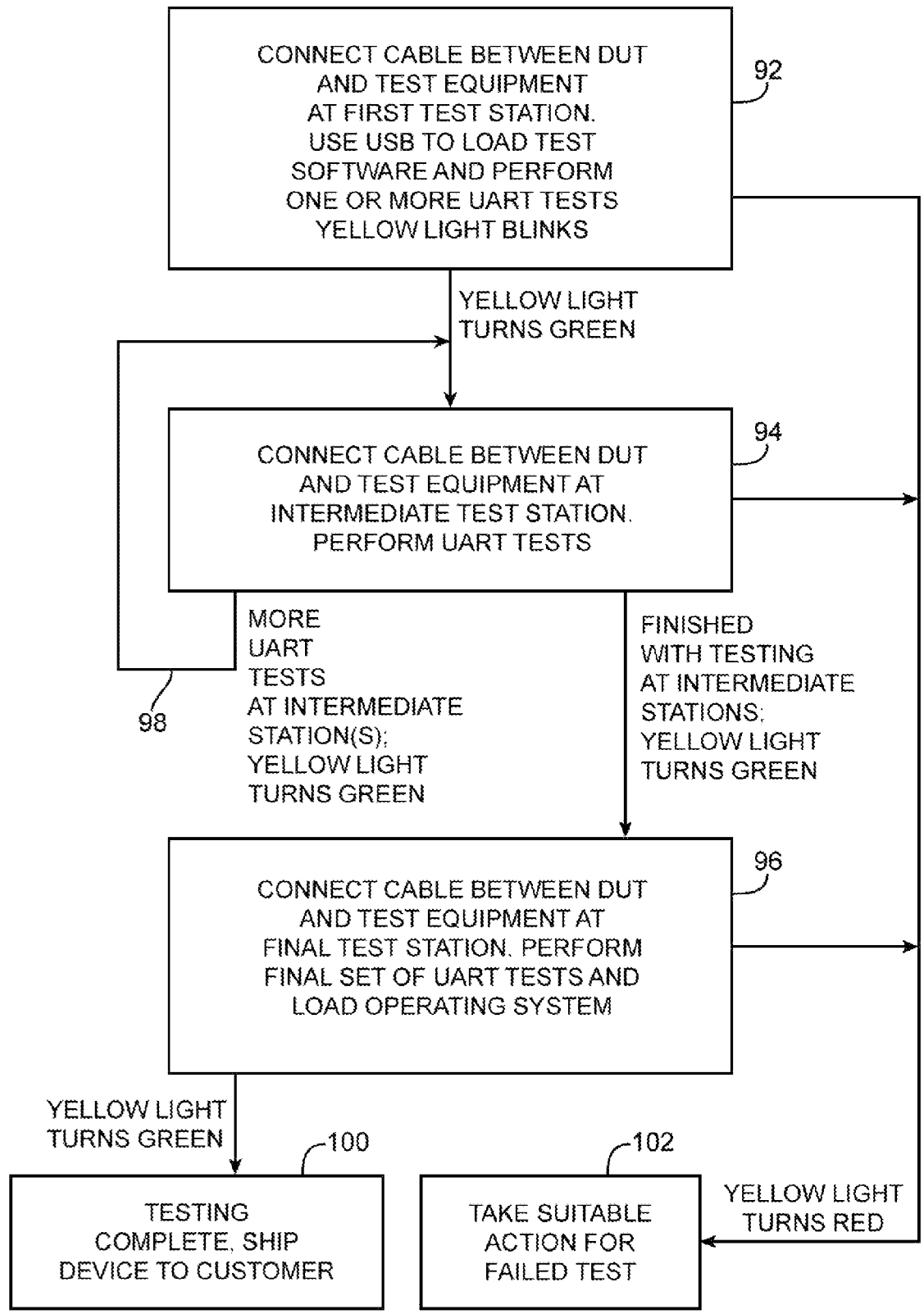
FIG. 5 is a flow chart of illustrative steps involved in testing electronic devices in accordance with an embodiment of the present invention.

FIG. 5 is a flow chart of illustrative steps involved in using test system 76 of FIG. 4. At step 92, cable 36 may be coupled between device under test 10 and test equipment 30-1. Test equipment 30-1 may then load a test program onto device under test 10 using the USB path in cable 36. The USB path may also be used in conveying test logs and other test data from device under test 10 to test equipment 30-1. The UART path in cable 36 may then be used by test equipment 30-1 to perform one or more tests on device under test 10 (e.g., tests of audio circuitry, video circuitry, wireless circuitry, or other components in device under test 10). During these tests, the UART path may be used to convey test commands from test equipment 30-1 to device under test 10 and may be used to convey corresponding test results from device under test 10 to test equipment 30-1.

During testing at test station TS1 with test equipment 30-1, yellow indicator light Y on cable 36 may be illuminated (e.g., by flashing) to indicate to the operator that tests are being performed. Once testing is complete, the red or green indicator light may be illuminated to indicate a fail or pass condition, as appropriate. If the red indicator light is illuminated to indicate that tests have failed, appropriate actions may be taken at step 102 (e.g., the device under test may be scrapped, reworked, or retested).

If testing succeeds (i.e., the green indicator light is lit), testing can proceed to step 94. During the operations of step 94, the operator may connect device under test 10 to test equipment 30-K in one or more intermediate test stations TSK and can use the UART path in cable 36 (or in cable 78) to convey test commands and test results between test equipment 30-K and the device under test. The yellow indicator light may be illuminated to indicate the presence of active testing. Additional tests may be performed on one or more additional intermediate test stations, as indicated by line 98. If tests fail, the red indicator light may be illuminated and appropriate actions taken at step 102. If tests succeed, the green indicator light may be illuminated and processing may proceed to final test station TSN.

At final test station TSN, test equipment 30-N may perform any desired final tests using the UART path in cable 36. The yellow status indicator light may be illuminated during tests. If testing fails, the red indicator light may be illuminated and appropriate actions may be taken at step 102. If testing succeeds, test equipment 30-N may load a customer-ready operating system onto the device under test using the USB path in cable 36 and the green indicator light may be illuminated. The device into which the operating system has been loaded may then be shipped to a customer (step 100).

The foregoing is merely illustrative of the principles of this invention and various modifications can be made by those skilled in the art without departing from the scope and spirit of the invention.

What is claimed is:

1. A method for performing tests using a test system having test equipment that is coupled to devices under test by a cable, comprising:
    at a test station in the test system, transferring data between test equipment and the device under test through the cable using both a first communications protocol and a second communications protocol during manufacture of the devices under test, wherein the cable comprises a wired path having first and second connectors at opposing ends of the wired path;
    transferring software from the test equipment to the devices under test using the first communications protocol and a first set of contacts in the second connector; and
    transferring test commands from the test equipment to the devices under test using the second communications protocol and a second set of contacts in the second connector that is different from the first set of contacts so that multiple types of test operations are performable at a single test station.

2. The method defined in claim 1 wherein the first communications protocol comprises a Universal Serial Bus protocol and wherein transferring the data comprises transferring data between the test equipment and the device under test using the Universal Serial Bus protocol.

3. The method defined in claim 2 wherein the second communications protocol comprises a Universal Asynchronous Receiver-Transmitter protocol and wherein transferring the data comprises transferring the data between the test equipment and the device under test using the Universal Asynchronous Receiver-Transmitter protocol.

4. The method defined in claim 3 wherein the cable comprises a wired path, first and second connectors at opposing ends of the wired path, and control circuitry interposed within the wired path, wherein the first connector is configured to be connected to the test equipment, wherein the second connector is configured to be connected to the device under test, wherein the control circuitry includes a first Universal Serial Bus endpoint that supports communications with the test equipment through the first connector, wherein the control circuitry includes a second Universal Serial Bus endpoint that supports communications with the device under test through a first set of contacts in the second connector, and wherein the control circuitry includes a Universal-Serial-Bus-Universal-Asynchronous-Transmitter-Receiver converter that supports communications with the device under test through a second set of contacts in the second connector using the Universal Asynchronous Receiver-Transmitter protocol, the method further comprising:
    transferring a test program to the device under test from the test equipment at the test station using the first and second Universal Serial Bus endpoints.

5. The method defined in claim 4 further comprising:
    transferring test commands to the device under test from the test equipment at the test station using the first Universal Serial Bus endpoint and the Universal-Serial-Bus-Universal-Asynchronous-Transmitter-Receiver converter.

6. A cable for use in connecting test equipment to a device under test in a test system, comprising:
    a first connector that is configured to connect to the test equipment;
    a second connector that is configured to connect to the device under test;
    a wired communications path between the first connector and the second connector; and
    control circuitry interposed within the wired communications path, wherein the control circuitry includes a first Universal Serial Bus endpoint that supports communications with the test equipment through the first connector, wherein the control circuitry includes a second Universal Serial Bus endpoint that is configured to convey software between the test equipment and the device under test through a first set of contacts in the second connector, and wherein the control circuitry includes a Universal-Serial-Bus-Universal-Asynchronous-Transmitter-Receiver converter that is configured to convey test commands between the test equipment and the device under test through a second set of contacts in the second connector by converting between a Universal Serial Bus protocol and a Universal Asynchronous Transmitter Receiver protocol.

7. The cable defined in claim 6 wherein the first connector comprises a Universal Serial Bus connector.

8. The cable defined in claim 7 wherein the second connector comprises a 30-pin data connector.

9. The cable defined in claim 8, further comprising a status indicator coupled to the control circuitry.

10. The cable defined in claim 9 wherein the status indicator comprises a plurality of light-emitting components that are selectively illuminated to provide a system operator with test status information during testing of the device under test by the test equipment.

11. The cable defined in claim 6 further comprising:
    a status indicator coupled to the control circuitry.

12. The cable defined in claim 11 wherein the status indicator comprises a plurality of light-emitting components that are illuminated to provide a system operator with test status information during testing of the device under test by the test equipment.

13. The cable defined in claim 12 wherein the light-emitting components comprise at least two light-emitting diodes of different colors.

14. A method of testing a device under test that is coupled to test equipment at a test station by a cable that has first and second connectors, comprising:
    at the test station, loading software into the device under test from the test equipment through both the first and second connectors using Universal Serial Bus communications and conveying data between the device under test and the test equipment through both the first and second connectors using Universal Asynchronous Receiver Transmitter communications, wherein conveying the data comprises conveying test commands from the test equipment to the device under test using a first set of contacts in the second connector, and wherein loading the software comprises loading the software from the test equipment into the device under test using a second set of contacts in the second connector that is different than the first set of contacts so that loading of the software and conveying of the test commands are both performed over the cable without coupling additional cables to the test station.

15. The method defined in claim 14 further comprising:
    illuminating status indicator lights on the cable in response to detection of a failed test while testing the device under test with the test equipment.

16. The method defined in claim 15 wherein loading the software comprises loading an operating system.

17. The method defined in claim 15 wherein loading the software comprises loading a test program into the device under test.

\* \* \* \* \*